United States Patent
Nguyen

(10) Patent No.: US 8,571,079 B1
(45) Date of Patent: Oct. 29, 2013

(54) AVERAGE-POWER CONTROL LOOPS AND METHODS THROUGH LASER SUPPLY VOLTAGE CLOSED-LOOP CONTROL

(75) Inventor: James Cong Nguyen, Portland, OR (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 13/482,836

(22) Filed: May 29, 2012

(51) Int. Cl.
*H01S 3/00* (2006.01)

(52) U.S. Cl.
USPC .................. 372/38.02; 372/38.01; 372/38.07

(58) Field of Classification Search
USPC .................. 372/38.01, 38.02, 38.07
See application file for complete search history.

(56) References Cited

U.S. PATENT DOCUMENTS

| | | | |
|---|---|---|---|
| 2009/0190621 A1* | 7/2009 | Anderson et al. | 372/38.03 |
| 2009/0238226 A1* | 9/2009 | Moto et al. | 372/38.02 |
| 2011/0235660 A1* | 9/2011 | Ikagawa | 372/20 |
| 2012/0051379 A1* | 3/2012 | Wang et al. | 372/38.01 |

* cited by examiner

*Primary Examiner* — Kinam Park
(74) *Attorney, Agent, or Firm* — Blakely Sokoloff Taylor & Zafman LLP

(57) ABSTRACT

Average-power control loops and methods through laser supply voltage closed-loop control. In accordance with one of the methods, a switching converter is coupled to provide power to a first terminal of a laser diode, a programmable current source is coupled to control the average current through a laser diode, an average power control circuit is coupled to a monitor diode to monitor the average power out of a laser diode and to control the programmable current source to maintain a desired average power out of a laser diode, and the output of the switching converter is adjusted responsive to the headroom of the programmable current source to limit the output of the switching converter to a voltage that will still assure adequate operation of the current source. Various embodiments are disclosed.

19 Claims, 4 Drawing Sheets

AVERAGE-POWER CONTROL LOOPS AND METHODS THROUGH LASER SUPPLY VOLTAGE CLOSED-LOOP CONTROL

BACKGROUND OF THE INVENTION

1. Field of the Invention

The present invention relates to the field of laser drivers for data communication, and more particularly to laser drivers for data communication in fiber optic networks.

2. Prior Art

Communication in fiber optic networks is done using a fiber optic transceiver module, typically in large numbers in data centers. Such transceiver modules include, among other things, a transmit laser diode and laser diode drive circuitry. Fiber optic transceiver modules dissipate considerable power, most of which is dissipated in the laser diode and in the driver circuitry. This has two major effects. First, it limits the number of ports or channels that may be used per switch card, thus requiring a larger space for a given number of ports. Second, the cost to operate the fiber optic transceiver modules, which normally operate 24 hours a day, is high. In that regard, the power bill is the single largest contributor to a data center's cost of equipment ownership, so that a reduction in the power consumption of the laser driver is free money to a data center.

DETAILED DESCRIPTION OF THE PREFERRED EMBODIMENTS

Figure 1:
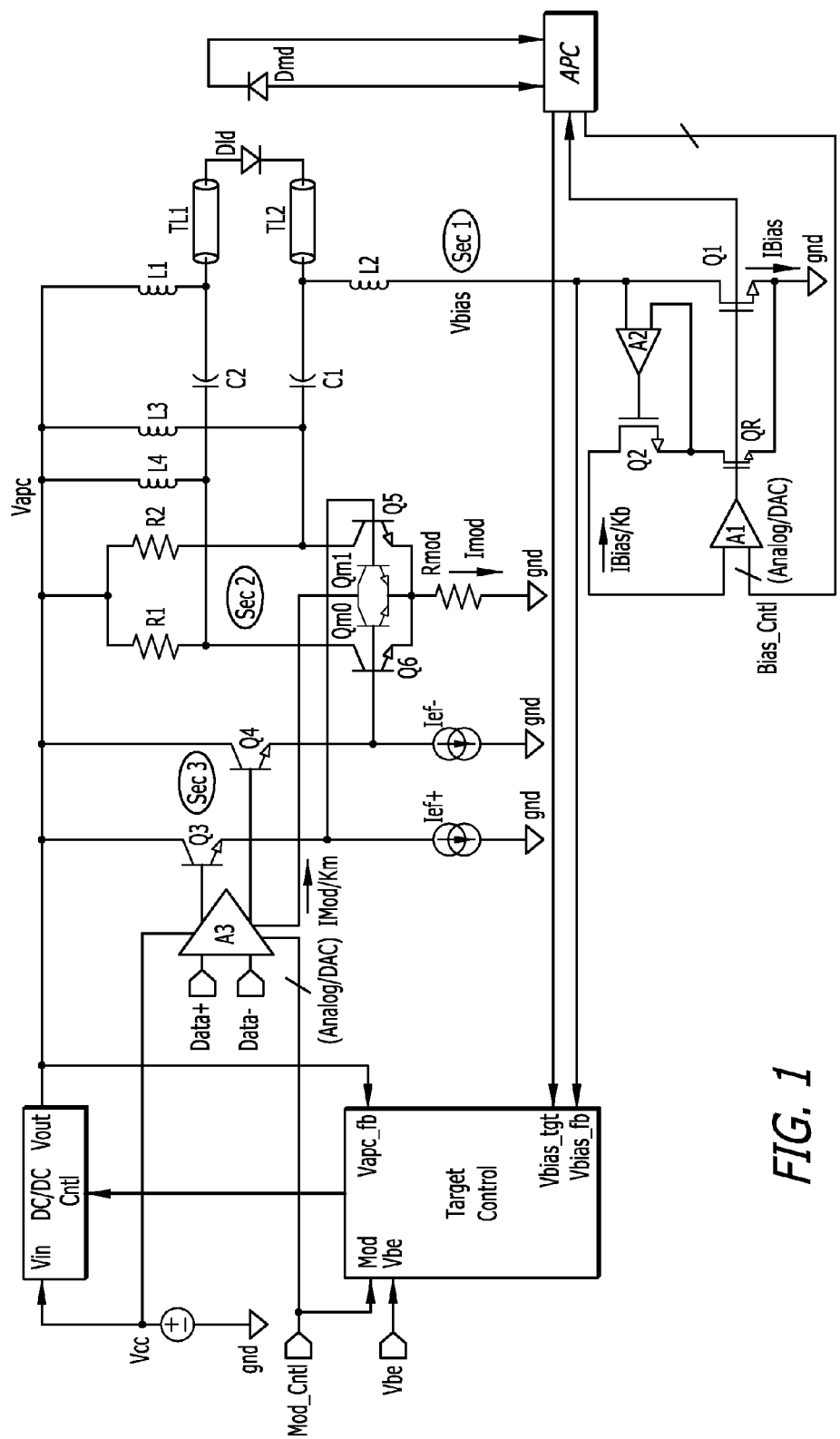
FIG. 1 is a diagram of one embodiment of the present invention.

First referring to FIG. 1, one embodiment of the present invention may be seen. A monitor diode Dmd is positioned to receive a fraction of the emission of the transmit laser diode Dld to provide a measure of the output of the laser diode to the average power control circuit (APC). The average power control circuit APC also provides a Bias_Cntl (bias control) signal to one input of amplifier A1, which controls the gate of transistor Q1 and the gate of replica transistor QR, which replica transistor is a relatively small fraction (1/Kb) of the size of the transistor Q1. The laser diode Dld is biased by the voltage (Vapc–Vbias), with Vbias being supplied as one input to differential amplifier A2. The other input to amplifier A2 is provided by the drain voltage of the replica transistor QR. Transistor Q2 has its gate controlled by differential amplifier A2, with its drain forming the second input to differential amplifier A1. In operation, differential amplifier A2 drives the gate of transistor Q2 so that the differential input to amplifier A2 is zero. Thus the drain voltage on the replica transistor QR is equal to the drain voltage on the transistor Q1, namely the voltage Vbias. The gate voltage of transistor Q1, which is the output of amplifier A1 and the gate voltage of replica transistor QR, is also coupled as an input to the APC. This loop has a frequency response that is high, making Q1 look like a programmable current source responsive to the Bias_Cntl signal. While the APC is controlling IBias through the Bias_Cntl signal, it is also monitoring the gate voltage of transistor Q1 to be sure that that gate voltage remains at the desired operating voltage or within the desired operating range. Too high a gate voltage on transistor Q1 means that it is struggling to provide the desired bias current to the laser diode Dld because the programmable current source does not have sufficient headroom for satisfactory operation, and accordingly, the APC adjusts Vbias_tgt upward, increasing the output of the DC/DC converter to adjust Vapc upward so that while the average power control loop still maintains the bias of the laser diode Dld at (Vapc–Vbias), the higher Vapc increases the headroom of the programmable current source to bring down the gate voltage on transistor Q1 while still maintaining the bias of the laser diode. Too low a voltage on the gate of transistor Q1 means that the voltage Vapc supplying the laser diode (and other sections of the average power control loop) is higher than needed, and is unnecessarily wasting power. Accordingly, the APC adjusts Vbias_tgt downward, decreasing the output of the DC/DC converter to adjust Vapc downward so that while the average power control loop again still maintains the bias of the laser diode Dld at (Vapc–Vbias), the lower Vapc decreases the headroom of the programmable current source to bring up the gate voltage. The new effect is that the voltage Vapc is automatically adjusted (and limited) to minimize the power consumed by the laser circuit while still maintaining an adequate but not excessive headroom for the programmable current source for various operating conditions.

It will be noted that the output Bias_Cntl of the average power control APC forming one input to amplifier A1 can be an analog or digital signal, such as by way of example a 10 bit digital signal. Amplifier A1 is of course an analog amplifier, and accordingly, if the signal Bias_Cntl is an analog signal, it may be applied directly to amplifier A1. If it is a digital signal, then amplifier A1 would need to be preceded by a digital to analog converter. In that regard, the same comments apply to amplifier A3, the function of which will be subsequently described.

The voltage Vbias is also coupled to the target control as the feedback voltage Vbias_fb. The target control responds to the error between the target bias voltage Vbias_tgt and the feedback bias voltage Vbias_fb to control the output voltage Vout (Vapc) of the DC/DC converter coupled between VCC and what are referred to on FIG. 1 as Sec 3, Sec 2 and Sec 1 to assure a minimum but still adequate biasing for the laser diode Dld. In the embodiment shown, Sec 1 consists of the laser diode Dld and its immediate associated circuitry, namely, a low resistance connection through an inductance L1 to the output of the DC/DC converter Vout, 25 ohm transmission lines TL1 and TL2 to and from the laser diode Dld and a second low resistance inductor L2 to the bias voltage Vbias, as determined by transistor Q1 and its associated circuitry. Sec 2 comprises the driver circuitry, namely transistors Q5 and Q6, resistors R1 and R2, replica transistors Qm0 and Qm1, inductor L3 and coupling capacitor C1 and optional coupling capacitor C2 and inductor L4, and Sec 3 is a predriver comprising transistors Q3 and Q4 and current sources Ief+ and Ief–. Preferably the transistors of Sec 1, Sec 2 and Sec 3 are all npn transistors, though that is not a limitation of the invention. In some embodiments, transistors Qmq and Qml have their common emitter connection coupled to the circuit ground through their own replica resistor, namely a resistor that is larger than resistor Rmod by the same factor that Qm0 and Qm1 are smaller than Q5 AND q6.

Amplifier A3 is a low power data amplifier, powered from the supply voltage Vcc, which receives the differential data input signal Data+ and Data–, as well as a modulation control signal Mod_Cntl. This modulation control signal controls the voltage difference output by amplifier A3 to the bases of transistors Q3 and Q4, with the state (polarity) of that output being determined by the state of the data input signal. Amplifier A3 also monitors the current through the replica transistors Qm0 and Qm1 and adjusts the output of amplifier A3 to the bases of transistors Q3 and Q4 according to the modulation control signal Mod_Cntl and the feedback signal IMOD/Km so that the actual modulation to the laser diode Dld is in accordance with that specified by the modulation control signal Mod_Cntl. Note that amplifier A3, a low power amplifier, is the only component of the circuit which is powered by the power supply VCC, other than the switching DC/DC converter. All the rest of the circuitry, including Sec 1, 2 and 3, are powered by the output of the DC/DC switching converter. A replica transistor, as used herein and in the claims to follow, is a transistor which replicates a small fraction of the current of another transistor to which it is connected.

The output of amplifier A3 controls the bases of transistors Q3 and Q4, which are biased by current sources Ief+ and Ief−, respectively. In turn, the emitters of transistors Q3 and Q4 control the emitters of transistors Q5 and Q6, which have a common emitter connection through a resistor Rmod to ground gnd, with the collectors of transistors Q5 and Q6 being coupled to the output of the DC/DC converter through equal resistors R1 and R2. The collector of transistor Q5 is also connected through coupling capacitor C1 to the short transmission line TL2 to the cathode of the laser diode Dld, with the collector of transistor Q6 being coupled to the anode of the laser diode Dld through optional capacitor C2 and a short transmission line TL1 and to Vapc through the inductor L1. There is also a third inductor L3 coupled between the collector of transistor Q5 and Vapc. In the event optional capacitor C2 is used, optional inductor L4 would also be used.

It may be seen that Vbias is set by the DC/DC switching converter, with the target control adjusting the output of the DC/DC converter so that the desired average power through the laser diode Dld can be most efficiently achieved. In particular, Q1 sets the laser diode Dld bias (Vapc−Vbias) for a given value of Vapc through the Bias_Cntl signal, though the APC monitors the feedback from the gate of transistor Q1, and when that voltage drifts up, readjusts Vbias_tgt upward, which causes the Target Control to adjust the DC/DC converter output Vapc upward. This increases the drain voltage of transistor Q1 upward until the value of Vbias_fb is equal to Vbias_tgt, which will cause the gate voltage of transistor Q1 to decrease to the desired level. Of course the reverse happens when the gate voltage of transistor Q1 drifts down to bring that gate voltage back to the desired level. Thus the DC/DC converter is adjusted to enable achieving the desired average power through the laser diode Dld and at the same time is limiting the voltage to the laser driver transistors Q5 and Q6 (Sec 2) and to the preamplifier transistors Q3 and Q4 (Sec 3). This allows the circuit to operate at a minimum voltage Vapc, thus a minimum power, for the given operating conditions, as opposed to operating all or substantially all of the circuit at a fixed voltage adequate for all operating conditions, thereby very substantially reducing the power consumption in the circuit.

Figure 2:
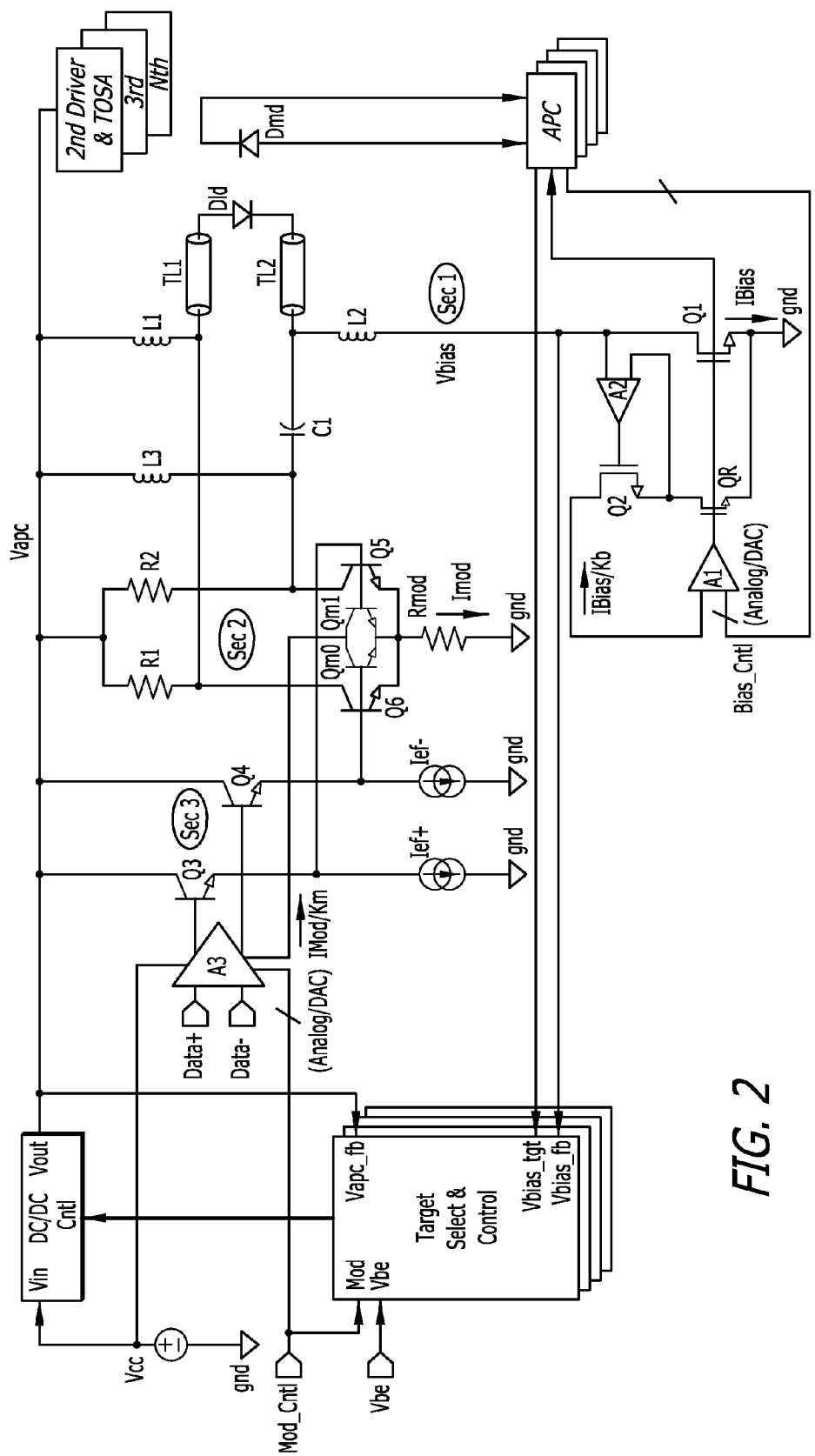
FIG. 2 is a diagram of another embodiment of the present invention.

Now referring to FIG. 2, an alternate embodiment of the invention may be seen. Functionally, this embodiment is substantially identical to the embodiment of FIG. 1, though in addition, incorporates additional drivers and transmitter optical subassemblies (TOSA), additional average power controls (APCs) and additional target controls. The additional average power controls APC and target controls are for each additional driver and transmitter optical subassembly TOSA. This provides multiple channels, all of which may operate off of the same DC/DC converter. In that regard, it is less expensive and requires less board space to provide a larger DC/DC converter in comparison to providing multiple smaller DC/DC converters. The only penalty for doing so is the fact that the DC/DC converter must provide an adequate output voltage Vout to operate the driver and transmitter optical subassembly requiring the highest voltage to maintain the desired average power through the laser diode. This actually is a small penalty to pay, as the different voltage requirements of replicas of the same circuit will differ only by a relatively small increment, certainly much smaller than the normal increment required to operate the circuit from a fixed power supply such as Vcc under all operating conditions. The circuit described automatically seeks the lowest voltage which will operate the most demanding driver and transmitter optical subassembly that is driven by the same DC/DC converter. Consequently, the present invention provides a very substantial power reduction, substantially reducing a data center's cost of power, and also allows denser packing of optical transceivers because of the reduced heat generation per optical transceiver.

Figure 3:
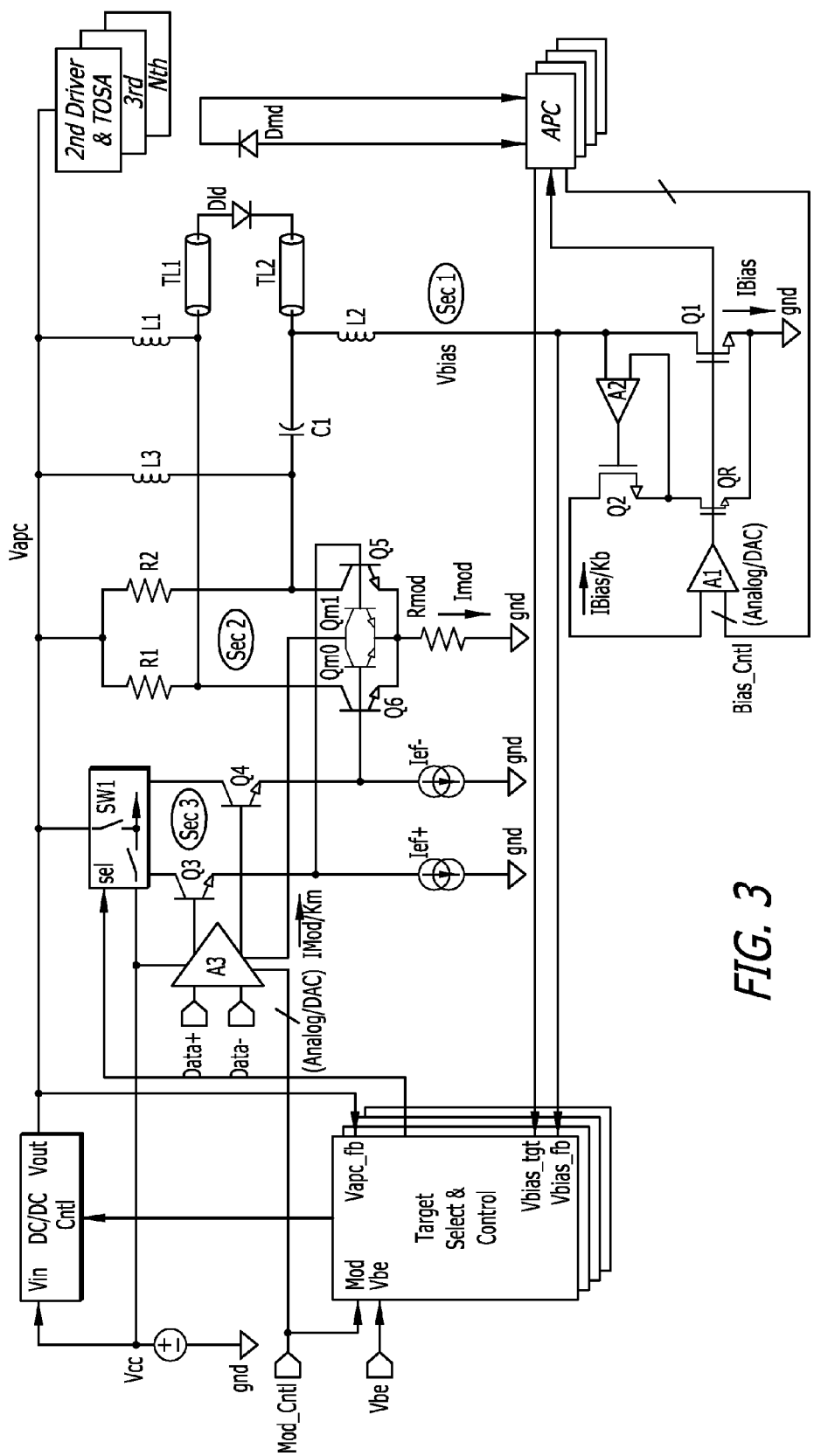
FIG. 3 is a diagram of a third embodiment of the present invention.

FIG. 3 is similar to FIG. 2 but further includes a switching block SW1 which provides a safeguard against improper function in the event the output voltage of the DC/DC converter goes too low under certain operating conditions to maintain proper operation of the entire circuit. In particular, the voltage Vapc required by the specific circuits of the various sections of the disclosed embodiment are as follows.

For Sec 1: Vld@IBias+Vbias_tgt
   Where:
      Vld@IBias is the voltage drop across the laser diode Vld with a current IBias through the laser diode
      Vbias_tgt is the minimum Vds (drain emitter voltage of transistor Q1 such that transistor Q1 can deliver the required IBias
For Sec 2: Q5/Q6 Headroom (typically 0.6V-0.7V)+ IMod*(R1)/2
For Sec 3: 2*Vbe+IMod*Rmod−Vbc (typically 0.3V)
   where:
      2*Vbe=VbeQ3+VbeQ5 (or VbeQ4+VbeQ6)
      Vbc=the base-collector voltage of transistor Q3 (or Q4)

For particularly low temperatures, the Vbe of each of transistors Q3-Q6 will rise to the point that Sec 3 will require a higher supply voltage to operate than Sec 1 and Sec 2. Since Vapc is controlled in a closed loop by monitoring Sec 1, under cold conditions, Vapc might be too low to maintain the proper operation of Sec 3. To prevent this, switch SW1 would be switched by the select signal Sel so that Sec 3 is powered from Vcc rather than the output Vout (Vapc) of the switching DC/DC converter. This is of no significant consequence, as Sec 3 is a relatively low power section at low temperature, and at such low temperature, the other sections are themselves using less power. Further, the low temperature means that nothing is on the verge of overheating.

Figure 4:
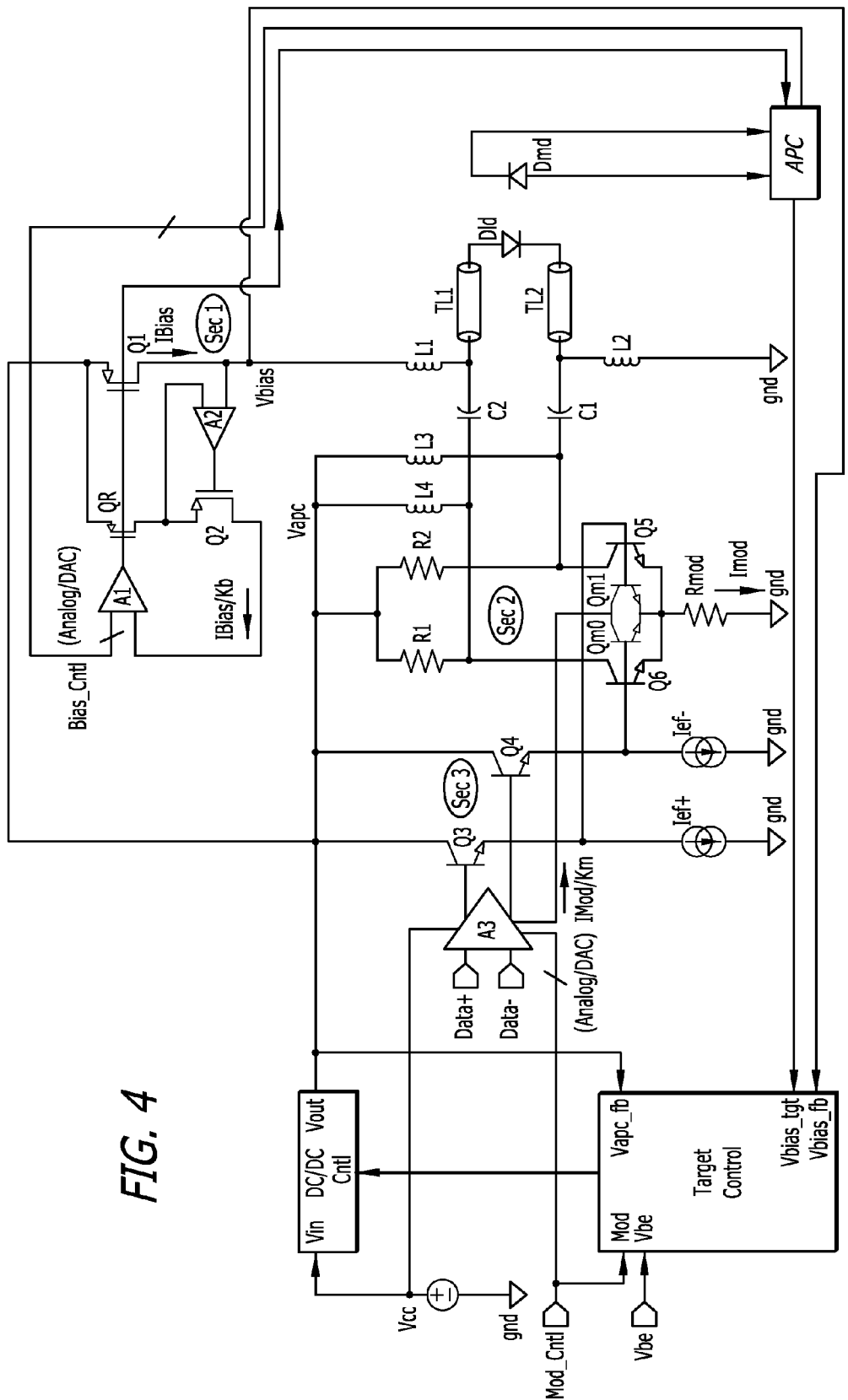
FIG. 4 is a diagram of another embodiment of the present invention.

FIG. 4 is a circuit diagram of another embodiment of the present invention, and may be used in place of the circuit of FIG. 1 or used in the embodiments of FIGS. 2 and 3 in place of the embodiment of FIG. 1. In particular, in FIG. 1, the programmable current source comprising transistor Q1 and the associated circuitry is in series with the laser diode Dld, but is between the laser diode Dld cathode and ground. In FIG. 4, the programmable current source comprising transistor Q1 and the associated circuitry is also in series with the laser diode Dld, but is between the voltage Vapc and the laser diode Dld anode. Functionally the two circuits are the same, though the circuit of FIG. 4 has the advantage of better suppressing the ripple caused by the DC/DC switching converter, which has a much lower frequency than the response of the programmable current source of Q1. The voltage Vapc required by the specific circuits of the various sections of the disclosed embodiment are as follows.

Vapc Target to satisfy:
Sec 1: Vld@IBias+(Vapc−Vbias_tgt) (such that a minimum |Vds| on Q1 can deliver the required IBias)
For Sec 2: Q5/Q6 Headroom (typically 0.6V-0.7V)+ IMod*(R1)/2
For Sec 3: 2*Vbe+IMod*Rmod−Vbc (typically 0.3V) where:
2*Vbe=VbeQ3+VbeQ5 (or VbeQ4+VbeQ6)
Vbc=the base-collector voltage of transistor Q3 (or Q4)

In FIG. 4, optional capacitor C2 and inductor L4 are shown. As a still further alternate embodiment, optional capacitor C2 and inductor L4 may be eliminated and the upper lead of L3 connected to Vbias instead of Vapc.

As an alternative, one could monitor the entire circuit, including its operating temperature, and calculate a minimum Vapc that will maintain proper operation of all of Sec 1, 2 and 3 under the then present operating conditions, and not allow the value of Vapc to go below that minimum, even if the average laser diode Dld power could apparently be met for a lower Vapc.

The net effect of the present invention is that the power consumption of fiber optic transceiver modules is substantially reduced, providing among other things, a substantial reduction in cost because of the power savings to the user of the fiber optic transceiver modules, and the ability to increase the number of transceiver modules per switch card, reducing system cost. While certain preferred embodiments of the present invention have been disclosed and described herein for purposes of illustration and not for purposes of limitation, it will be understood by those skilled in the art that various changes in form and detail may be made therein without departing from the spirit and scope of the invention.

What is claimed is:

1. An average laser power control loop comprising:
a laser diode drive circuit coupled to a laser diode circuit for coupling to first and second terminals of a laser diode; a switching converter having an output voltage coupled to power the laser diode circuit when the first and second terminals of the laser diode are connected to the laser diode circuit; a programmable current source in the laser diode circuit coupled to control a current through the laser diode from the switching converter; an average power control for coupling to monitor an output of a monitor diode and to provide a target voltage to a target control; the target control also being coupled to a first output of the programmable current source, the target control controlling the output voltage of the switching converter to provide a voltage to the laser diode circuit that causes a voltage output of the current source to be equal to the target voltage; the average power control also being coupled to a second output of the programmable current source that is responsive to a headroom of the programmable current source to adjust the target voltage to maintain an adequate headroom for the programmable current source.

2. The average laser power control loop of claim 1 wherein the output of the switching converter is also coupled to power the laser diode drive circuit.

3. The average laser power control loop of claim 2 wherein the output of the switching converter is also coupled to power a laser pre-drive circuit.

4. The average laser power control loop of claim 3 further comprising a switch coupled to power the laser pre-drive circuit from a power supply before the output of the switching converter becomes too low for the control loop to operate.

5. The average laser power control loop of claim 3 wherein an input of the laser pre-drive circuit is coupled to an output of a data amplifier that is responsive to a data input.

6. The average laser power control loop of claim 2 wherein the laser diode drive circuit comprises first through fourth npn transistors;
the first and second npn transistors having their collectors each coupled to the output of the switching converter through a respective resistor, the collector of the first transistor also being coupled to the anode of the laser diode, the collector of the second transistor also being coupled through a capacitor to a connection for connecting to the cathode of a laser diode, the emitters of the first and second transistors being coupled together and through a resistor to a circuit ground;
the third and fourth transistors being replica transistors for the first and second transistors, respectively, the third transistor having its base connected to the base of the first transistor, its emitter connected to the emitter of the first, second transistors and fourth transistors, and its collector connected to the collector of the fourth transistor and as a feedback signal to the data amplifier, the base of the fourth transistor being connected to the base of the second transistor.

7. The average laser power control loop of claim 6 further comprising a data amplifier wherein the data amplifier has a differential data input and a differential data amplifier output coupled to the bases of the first and second transistors, the data amplifier also being responsive to a modulation control input and the feedback signal to control a differential amplitude of the differential data amplifier output to provide a laser diode modulation in accordance with the modulation control input.

8. The average laser power control loop of claim 7 further comprising a laser pre-drive circuit wherein the laser pre-drive circuit comprises fifth and sixth transistors and first and second current sources, the emitters of the fifth and sixth transistors being coupled to the bases of the first and second transistors and through a respective one of the first and second current sources to the circuit ground, the collectors of the fifth and sixth transistors being coupled to the output of the switching converter, and the bases of the fifth and sixth transistors being coupled to the differential data amplifier output.

9. The average laser power control loop of claim 8 wherein the first through sixth transistors are npn transistors.

10. The average laser power control loop of claim 1 wherein the target control controls the switching converter responsive to a bias voltage and a target bias voltage to limit the output of the switching converter at a voltage adequate to bias the laser diode to provide a target average laser power.

11. The average laser power control loop of claim 1 wherein a single switching converter is shared with a plurality of average laser power control loops, and wherein the target control controls the switching converter responsive to the bias voltages and the target bias voltages to limit the output of the switching converter at a voltage adequate to bias all laser diodes to provide the target average laser power for each laser diode.

12. The average laser power control loop of claim 1 wherein the programmable current source comprises a transistor, and wherein the second output of the programmable current source is the voltage on a control terminal of the transistor.

13. A method of controlling a laser diode comprising:

providing a switching converter coupled to provide power to a laser diode;

providing a programmable current source coupled to control an average current through the laser diode;

providing an average power control circuit for coupling to a monitor diode to monitor an average power out of the laser diode and to control the programmable current source to maintain a desired average power out of the laser diode, and; adjusting the output of the switching converter responsive to a headroom of the programmable current source to limit an output of the switching converter to a voltage that will still assure adequate operation of the programmable current source.

14. The method of claim 13 wherein the switching converter is coupled to also provide power to a laser diode drive circuit.

15. The method of claim 14 wherein the output of the switching converter is also coupled to power a laser diode pre-drive circuit.

16. The method of claim 15 further comprised of switching the laser pre-drive circuit from the output of the switching converter to a power supply before the output of the switching converter becomes too low.

17. The method of claim 15 further comprising controlling the input of the laser pre-drive circuit by an output of a data amplifier that is responsive to a data input.

18. The method of claim 17 wherein the data amplifier has a differential data input and a differential data amplifier output coupled to the input of the laser pre-drive circuit, the data amplifier also being responsive to a modulation control input and a feedback signal from the laser drive circuit to control a differential amplitude of the differential data amplifier output to provide the laser diode modulation in accordance with the modulation control input.

19. The method of claim 13 wherein a single switching converter is shared with a plurality of average laser power control loops, and wherein the switching converter is controlled to limit the output of the switching converter to a voltage adequate to bias all laser diodes to provide the target average laser power for each laser diode.

* * * * *